United States Patent [19]
Park

[11] Patent Number: 5,728,620
[45] Date of Patent: Mar. 17, 1998

[54] ISOLATION METHOD OF SEMICONDUCTOR DEVICE

[75] Inventor: Moon-han Park, Seoul, Rep. of Korea

[73] Assignee: Samsung Electronics Co., Ltd., Kyungki-do, Rep. of Korea

[21] Appl. No.: 591,826

[22] Filed: Jan. 25, 1996

[30] Foreign Application Priority Data

Apr. 21, 1995 [KR] Rep. of Korea ............ 95-9455

[51] Int. Cl.$^6$ ........................................ H01L 21/76
[52] U.S. Cl. .................. 438/425; 438/426; 438/296; 438/297
[58] Field of Search .................. 437/69, 70, 67; 438/294, 296, 297, 298, 424, 425, 426

[56] References Cited

U.S. PATENT DOCUMENTS

| | | | |
|---|---|---|---|
| 4,892,614 | 1/1990 | Chapman et al. | 437/67 |
| 4,980,311 | 12/1990 | Namose | 437/67 |
| 4,994,406 | 2/1991 | Vasquez et al. | 437/67 |
| 5,116,779 | 5/1992 | Iguchi | 437/69 |
| 5,130,268 | 7/1992 | Liou et al. | 437/67 |

*Primary Examiner*—Trung Dang
*Attorney, Agent, or Firm*—Cushman Darby & Cushman Intellectual Property Group of Pillsbury, Madison & Sutro LLP

[57] ABSTRACT

A device isolation method divides a semiconductor substrate into active and inactive regions. A first device isolation layer is formed in a first inactive region using a trench isolation method. Then, local oxidation is used to form a second device isolation layer in a second inactive region which is wider than the first. A dishing phenomenon (generated during CMP processing) is eliminated, and proper device isolation is realized without exposing the active region.

9 Claims, 5 Drawing Sheets

ISOLATION METHOD OF SEMICONDUCTOR DEVICE

BACKGROUND OF THE INVENTION

The present invention relates to an isolation method of a semiconductor device, and more particularly, to an isolation method of a semiconductor device in which two different isolation layers are formed for a wider inactive region and a narrower inactive region to improve electrical characteristics of the semiconductor device.

In high integration semiconductor devices, the device isolation region is reduced, such that 0.45 µm and 0.25 µm design-rule technologies are needed for a 64 Mb and 256 Mb DRAM, respectively. Also, since the formation of the device isolation region is generally the initial step in the fabrication of virtually any such device and influences the dimensions of an active region and the process margin of a subsequent process step, means for planarizing the step difference of a field insulating layer is needed.

Generally, a local oxidation of silicon (LOCOS) method, which is widely used in the fabrication of semiconductor devices, results in several problems: a bird's beak phenomenon caused by lateral oxidation of the substrate, crystal defects in the substrate due to buffer layer stress resulting from thermal processing, and an undesired redistribution of ion-implanted impurities for a channel stopper layer. Each of these problems of the LOCOS method contributes to diminished electrical characteristics for higher levels of integration.

In order to solve the problems of the LOCOS method, a device isolation method using a trench has been proposed. Here, it is possible to reduce the drawbacks of the LOCOS method caused by the thermal oxidation process, since a field oxide layer is not formed by a thermal oxidation process.

However, in the process of forming the trench in the substrate, crystal defects still appear in the substrate and the profile of insulating material refilled in a wide trench pattern, in the case of refilling the insulating material into the trench, is not uniform thereby causing an unstable device isolation characteristic and a structural step difference, which becomes yet other problem.

The device isolation method by the LOCOS and the trench will be explained briefly with reference to the drawings as follows.

FIGS. 1 and 2 are cross sectional views for explaining the conventional LOCOS isolation method.

As shown in FIG. 1, pad oxide layer 3 and silicon nitride layer 5 are stacked on semiconductor substrate 1 and then silicon nitride layer 5 in inactive region 9 is removed by photo-lithography. Thereafter, channel stopper ions 7 are implanted into inactive region 9 to thereby separately form inactive region 9 and an active region 11.

As shown in FIG. 2, if the semiconductor substrate, on which inactive region 9 and active region 11 are separately formed, is put into an oxidation furnace so as to be subjected to a thermal oxidation process under a predetermined condition, a field oxide layer 13 is formed on inactive region 9.

FIG. 2 shows a device isolation structure formed by the LOCOS method. Channel stopper region 15, where redistribution of impurity ions are realized by thermal diffusion, is located under field oxide layer 13. Also, during the thermal oxidation process, pad oxide layer 3 adjacent to inactive region 9 is oxidized to a direction of the active region to thereby generate the bird's beak phenomenon.

Accordingly, a length 20 of the inactive region becomes greater than that of initial inactive region 17 by as much as a bird's beak generation region 19. The bird's beak phenomenon restricts a limit of a design rule for foxing a micro pattern, thereby becoming a hindrance in the high integration of a semiconductor.

Also, in the LOCOS method, the field oxide layer is thermally grown up to a thickness of about 5,000 Å and the crystal defect is generated by the stress at a boundary of the active region under the silicon nitride layer which is selectively covered on the semiconductor substrate, so that leakage current between devices increases.

FIGS. 3 to 6 are cross sectional views according to process sequence for explaining the conventional trench isolation method.

As shown in FIG. 3, pad oxide layer 2 of about 240 Å is formed on semiconductor substrate 1. Then silicon nitride layer 4 of about 1,500 Å, formed by low-pressure chemical vapor deposition (LPCVD), and thermal oxide layer 6 of about 1,000 Å are sequentially formed. Then the thermal oxide layer of the inactive region is removed by a photolithography process.

As shown in FIG. 4, nitride layer 4 and pad oxide layer 2 are reactive-ion-etched, using the thermal oxide layer remained on the active region as an etching mask and then semiconductor substrate 1 is etched by dry etching to form a trench. At this time, the thermal oxide layer is etched together with the nitride layer the pad oxide layer and the trench according to an etching selection ratio, so that a little amount of the thermal oxide layer remains. Also, the trenches of a narrow region and a wide region coexist in the semiconductor substrate according to the design rule of the semiconductor device.

Next, a side wall oxide layer 8 is formed inside the trench by the thermal oxidation method, and polycrystalline silicon 10 is deposited to a thickness of 5,000 Å or more, and is anisotropically etched to only fill the polycrystalline silicon in the trench. At this time, while the trench of the narrow region is completely filled, a central portion of the trench of the wide region is depressed to generate a kind of loading effect in that the filling profile differs according to the size of the trench region.

As shown in FIG. 5, field oxide layer 12 is formed on the polycrystalline silicon filling the trench by the thermal oxidation method. However, the depressed portion of the trench of the wide region is not planarized.

As shown in FIG. 6, after buffer layers (thermal oxide layer, silicon nitride layer and pad oxide layer) are wet-etched by buffered oxide etchant (a mixed solution of ammonium fluoride ($NH_4F$) and hydrogen fluoride (HF) in a ratio of 7:1) and phosphoric acid solution, a sacrifice oxide layer (not shown) is grown up and then the grown up sacrifice oxide layer is wet-etched again to finish the device isolation process.

In the trench isolation method, a gate line and a bit line may be shorted or a wiring characteristic is deteriorated during a subsequent process due to depressed phenomenon (G) of the polycrystalline silicon of the central portion of the trench of the wide region resulting in a decrease of yield.

Also, due to the bird's beak phenomenon (R) caused during forming the field oxide layer, not only is there a limit to reduce a separated region, but also a predetermined thickness of the field oxide layer is simultaneously etched at the time of etching the thermal oxide layer of the buffer layer and, thus, the thickness of the field oxide layer must be further thickened taking into account the process margin, which causes the bird's beak phenomenon more seriously.

To solve the problems of the trench device isolation method, a chemical-mechanical polishing (CMP) method has been proposed.

In the CMP method, since the insulating material overfilling the trench is removed in the horizontal direction, the CMP method has been considered as an ideal method for completely filling the trench and thereafter etching the insulating material overfilling the trench. In the CMP method, however, if the width of the trench becomes on the order of several millimeters, a dishing phenomenon where the central portion of the wide trench region is depressed in a dish shape, is generated to cause an unstable device isolation characteristic and a structural step difference.

SUMMARY OF THE INVENTION

It is an object of the present invention to provide an isolation method of a semiconductor device where the electrical characteristics of the semiconductor device can be improved.

To accomplish the above object, there is provided an isolation method of a semiconductor device comprising the steps of: forming a first device isolation layer in a first inactive region of a semiconductor substrate by a trench isolation method; and forming a second device isolation layer in a second inactive region which is wider than the first inactive region by a local oxidation method.

It is preferable that the boundary of the first and second device isolation layer has a bird's beak region, generated during the formation of the second device isolation layer.

Also, the above object can be accomplished by an isolation method of a semiconductor device, according to the present invention, including the steps of: forming a first pattern on a semiconductor substrate to expose a first inactive region of said substrate; etching the exposed semiconductor substrate by the first pattern to form a trench; forming a first device isolation layer by filling insulating material in the trench; forming a second pattern on the semiconductor substrate to expose a second inactive region of the substrate; and forming a second device isolation layer in the second inactive region by the local oxidation method.

Here, a CMP or RIE step may be further included for etching back the first device isolation layer after the step of forming the first device isolation layer.

It is preferable that the bird's beak, which is generated during the local oxidation method for forming the second inactive region, shares a boundary with the trench.

In the present invention, it is preferable that the first inactive region exists in the cell array portion and the second inactive region exists in the peripheral circuit portion. It is further preferable that the first device isolation layer is formed of a CVD oxide layer.

According to the isolation method of a semiconductor device of the present invention, dishing can be prevented and proper device isolation can be achieved without exposure of the active region between the first and second isolation layers.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

A device isolation method by the present invention includes the steps of: (A) forming a first device isolation layer by a trench isolation method on a narrow inactive region; and then (B) forming a second device isolation layer on a wide inactive region by the LOCOS isolation method.

FIGS. 7–14 are cross-sectional views for illustrating one embodiment according to the process sequence to explain the device isolation method of the semiconductor device by the present invention.

Figure 1:
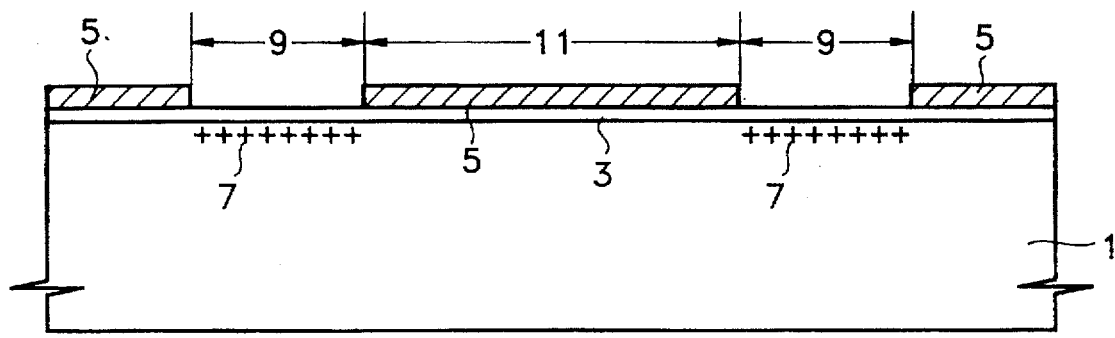
FIGS. 1 and 2 are cross-sectional views for explaining a conventional LOCOS device isolation method.
Figure 2:
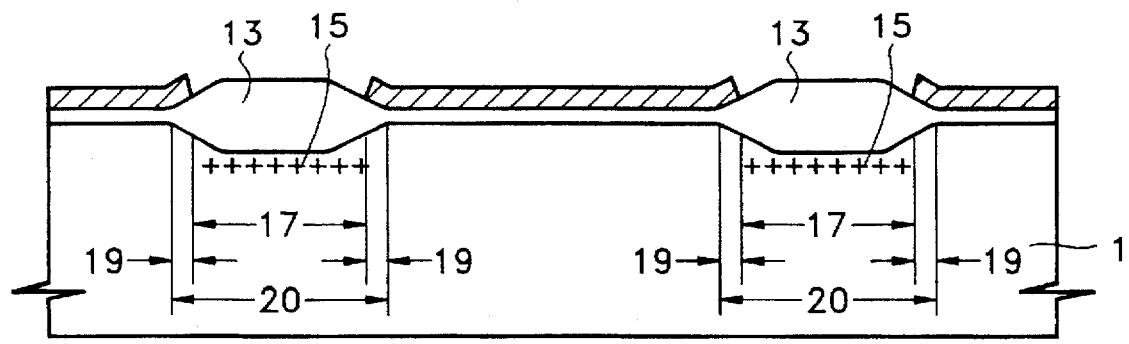
Figure 3:
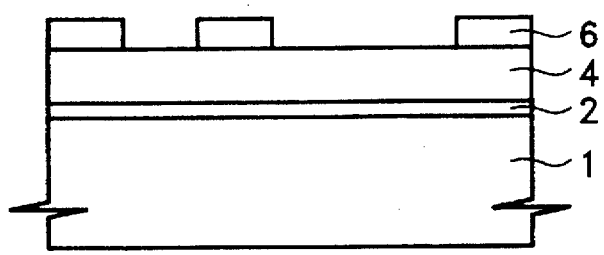
FIGS. 3–6 are cross-sectional views for explaining a conventional trench device isolation method.
Figure 4:
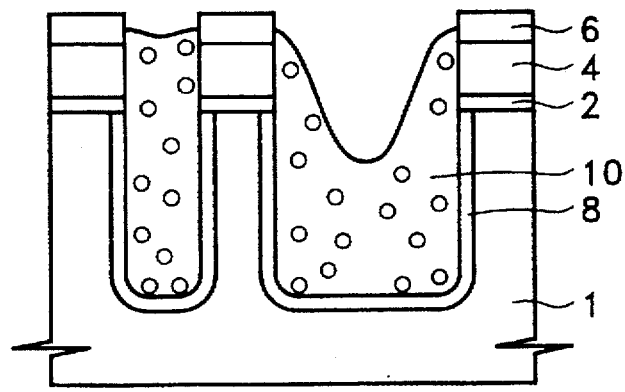
Figure 5:
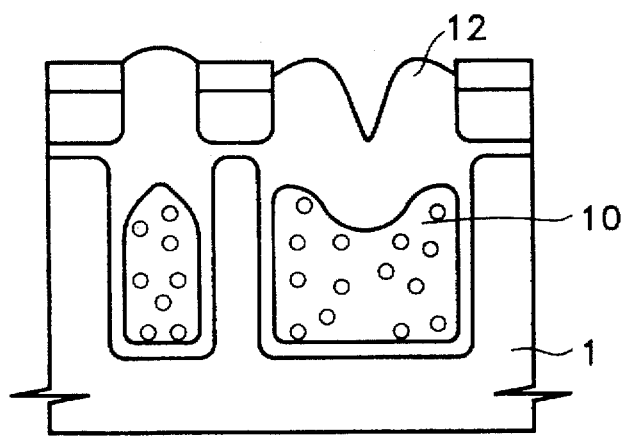
Figure 6:
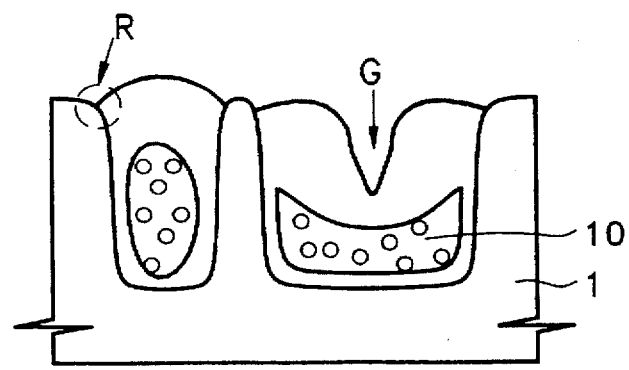
Figure 7:
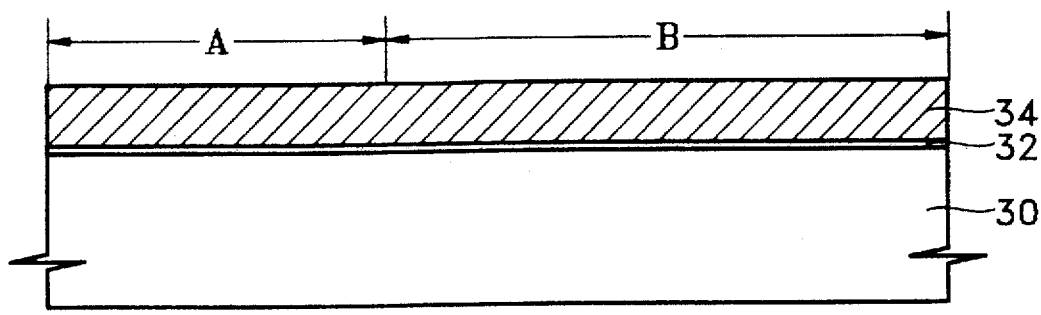
FIGS. 7–14 are cross-sectional views for explaining a device isolation method according to the present invention.

In FIG. 7, "A" portion denotes a cell array region and "B" portion denotes a peripheral region. In FIGS. 8 to 14, same reference numeral is given to a region which corresponds to a region of FIG. 7.

FIG. 7 is a cross sectional view for illustrating the step of forming pad oxide layer 32 and first silicon nitride layer 34 on semiconductor substrate 30. More particularly, a first step involves forming pad oxide layer 32 on semiconductor substrate 30 and a second step involves stacking first silicon nitride layer 34 on pad oxide layer 32.

Concretely, pad oxide layer 32 is formed to a thickness of, for example, about 110 Å–240 Å by a thermal oxidation method and first silicon nitride layer 34 is formed to a thickness of 1,500 Å–2,500 Å by, for example, a chemical vapor deposition CVD) method.

Figure 8:
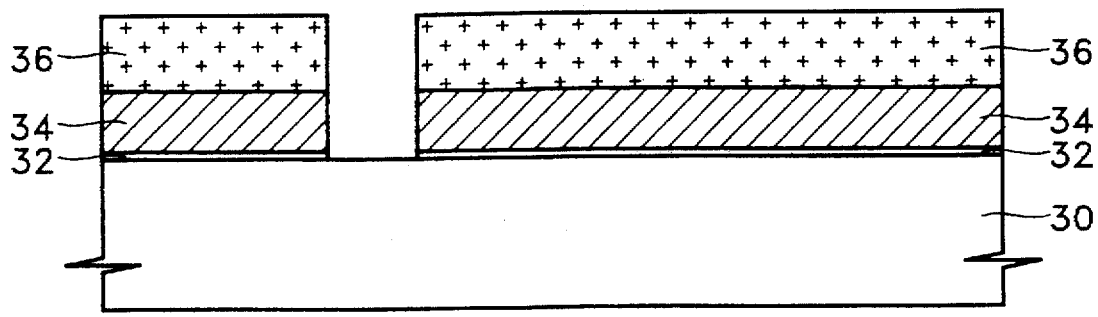

FIG. 8 shows a photolithography step for defining the inactive region of the cell array portion, which includes a first step of forming first photoresist pattern 36 on first silicon nitride layer 34 and a second step of etching the first silicon nitride layer and the pad oxide layer by using first photoresist pattern 36 as an etching mask.

Concretely, first photoresist pattern 36 is formed to have a shape for exposing the semiconductor substrate of the cell array portion, first silicon nitride layer 34 on the cell array portion is removed by an anisotropic dry etching and pad oxide layer 32 is etched by reactive ion etching or wet etching.

Figure 9:
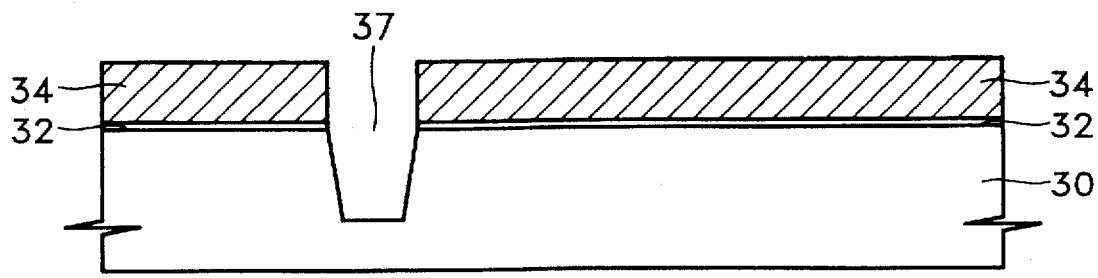

FIG. 9 shows the step of forming trench 37 in the semiconductor substrate of the inactive region of the cell array portion.

Concretely, the first photoresist pattern on the first silicon nitride layer is removed and the semiconductor substrate is etched to have a depth of about 2,000 Å–4,000 Å by using the first silicon nitride layer as the etching mask to thereby form trench 37. As an alternate method, first photoresist pattern (represented by reference numeral 36 of FIG. 8) may be used as the etching mask.

Figure 10:
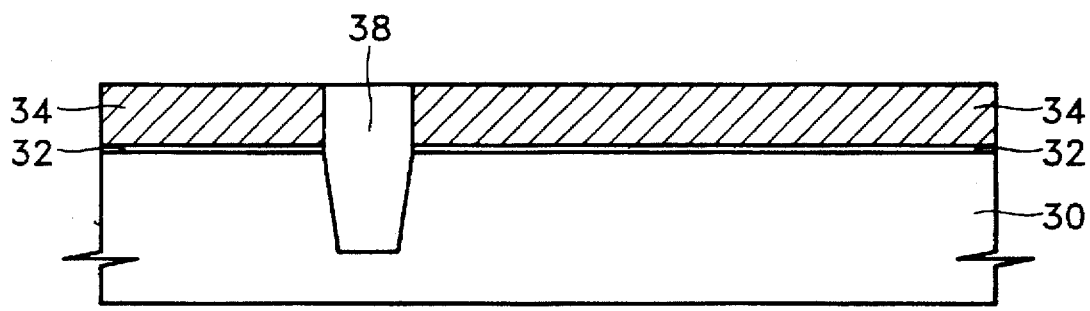

FIG. 10 shows the steps of forming first device isolation layer 38 by filling the trench, which includes a first step of filling the trench with insulating material and a second step of performing CMP over the whole surface of the resultant structure having the trench filled with insulating material.

Concretely, an oxide layer is deposited on the substrate on which the trench is formed by, for example, the CVD method, and then the CMP process is carried out over the whole surface of the resultant structure having the oxide layer thereon, until the surface of the first silicon nitride layer 34 is exposed to form the oxide layer only inside the trench.

As an alternate method, a reactive ion etching (RIE) is performed instead of the CMP process or the RIE is performed after the CMP process so that even the first silicon nitride layer may be etched.

Since the trench has a depth of about 2,000 Å–4,000 Å, the thickness of the CVD oxide layer deposited for filling the trench is maximally about 4,000 Å, which is very profitable in terms of process time and process margin in comparison with the thickness of about 5,000 Å–10,000 Å of the oxide layer for filling the trench in the conventional device isolation method using only the trench. Also, since only a narrow trench is formed on the semiconductor substrate and then the oxide layer is deposited, a surface of the substrate planarizes wholly thereby precluding the conventional dishing phenomenon even though a subsequent CMP process is carried out.

The trench isolation is realized in the cell array portion by processes from FIG. 7 to FIG. 10.

Figure 11:
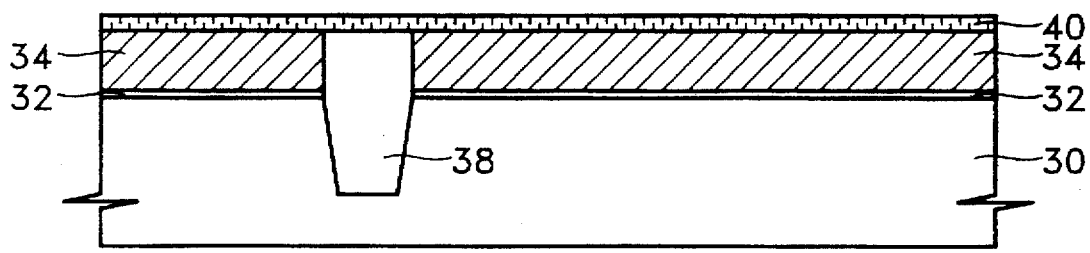

FIG. 11 shows the step of forming second silicon nitride layer 40.

Concretely, silicon nitride layer 40 is deposited on the substrate in which first device isolation layer 38 is formed, to a thickness of, for example, 300 Å–700 Å, which can protect the trench portion from an oxidation atmosphere of high temperature, to thereby form second silicon nitride layer 40.

When a peripheral portion is device-isolated by the thermal oxide layer by the local oxidation of a subsequent process, second silicon nitride layer 40 is provided for preventing an electrical characteristic change or a size change by the oxidation of the trench in a high temperature oxidation atmosphere.

Figure 12:
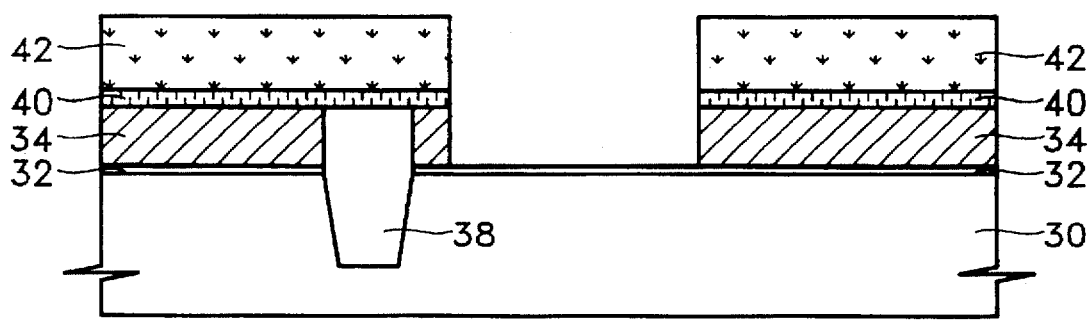

FIG. 12 shows the step of defining the inactive region for isolating the peripheral portion of the semiconductor substrate by a photolithography process, which includes a first step of coating photoresist on second silicon nitride layer 40 and then patterning the coated photoresist to form second photoresist pattern 42 for exposing the silicon nitride layer on the inactive region of the peripheral portion, a second step of etching second silicon nitride layer 40 by using second photoresist pattern 42 as an etching mask and a third step of etching first silicon nitride layer 34 to expose the pad oxide layer on the inactive region of the peripheral portion.

Figure 13:
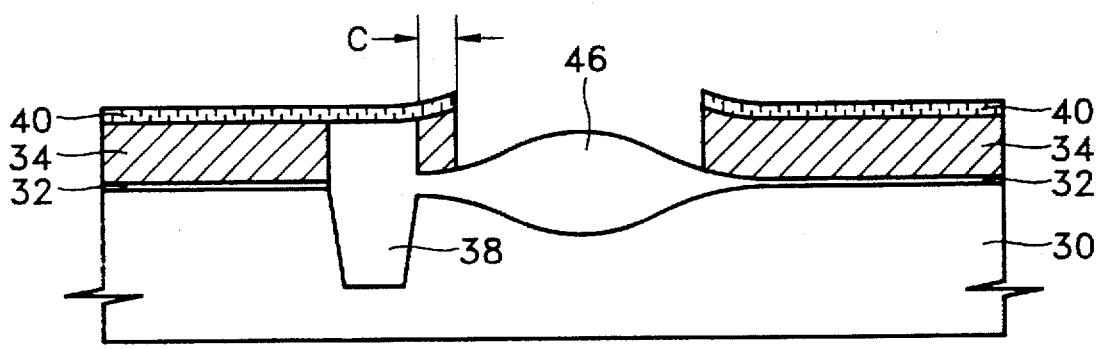

At this time, a misalign margin of the photolithography process becomes length "C" as shown in FIG. 13. Namely, in order not to expose the active region at a boundary of the thermal oxide layer and the trench filling oxide layer, a bird's beak generated during a subsequent local oxidation should form the boundary of the trench filling oxide layer and the thermal oxide layer and the boundary should be located within the "C" portion. Accordingly, the length of the bird's beak becomes the misalign margin of the photolithography process.

Generally, the length of the bird's beak generated by the local oxidation ranges from 5,000 Å to 10,000 Å. Accordingly, even though taking into account the situation where the misalignment of the photolithography process for a high integration semiconductor device is comparatively loosened 2,000 Å, "C" portion of the present invention can be a sufficient margin in the photolithography process.

FIG. 13 shows the step of forming second device isolation layer 46 in the inactive region of the peripheral portion.

Concretely, second device isolation layer 46 is formed in the inactive region of the peripheral portion, namely, a region where the pad oxide layer is exposed by photolithography process of FIG. 12, by high temperature thermal oxidation.

Accordingly, device isolation is realized in the peripheral portion with the thermal oxide layer by the local oxidation and the active region is not exposed at the boundary of the trench due to the bird's beak generated during forming of the thermal oxide layer.

The second silicon nitride layer plays a role in protecting the trench portion from an oxidation atmosphere during the oxidation process.

Figure 14:
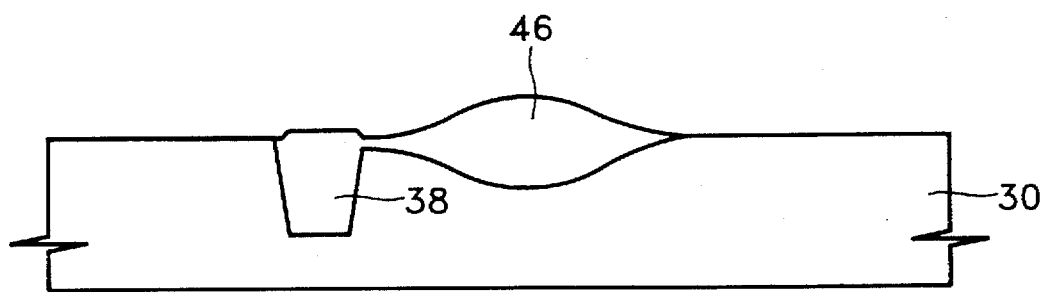

FIG. 14 shows the step of completing the device isolation by the LOCOS method and the trench isolation method of the present invention.

Concretely, the second silicon nitride layer and the first silicon nitride layer are removed by using a wet etching method and then the pad oxide layer is etched by the wet etching method and removed to complete the device isolation process.

At this time, the boundary portion ("C" portion of FIG. 13) of first device isolation layer 38 which filled in the trench, and second device isolation layer 46, formed by local oxidation, is formed by the thermal oxidation layer whose etching ratio is lower than that of the CVD oxide layer filled in the trench at the time of the wet etching process for removing the pad oxide layer. Thus, the device isolation without exposure of the active region can be realized.

In the device isolation method of the present invention, for a semiconductor device having a cell array portion and a peripheral portion, a device isolation layer is formed by the trench method in a narrow portion and CMP is carried out, so that the dishing phenomenon is avoided. Also, after the trench isolation process, a device isolation layer is formed in the wide portion by local oxidation so that device isolation can be realized without exposing the active region at the boundary of the two device isolation layers thereby improving the electrical characteristics of the device.

The present invention is not limited to the above embodiment and many variations can be made by those of ordinary skill in the art.

What is claimed is:

1. An isolation method of a semiconductor device, comprising the steps of:

forming a first device isolation layer in a first inactive region of a semiconductor substrate by a trench isolation method; and forming a second device isolation layer in a second inactive region which is wider than the first inactive region by a local oxidation method;

wherein a distance between said first device isolation layer and said second device isolation layer is less than 2000 Å; and wherein said first inactive region exists in a cell array portion and said second inactive region exists in a peripheral portion.

2. An isolation method as claimed in claim 1, wherein said first device isolation layer is formed of a chemical vapor deposition oxide layer.

3. An isolation method as claimed in claim 1, wherein the boundary of said first device isolation layer and said second device isolation layer is formed at a bird's beak region generated during said local oxidation method for forming said second device isolation layer.

4. An isolation method of a semiconductor device, comprising the steps of:

forming a first pattern on a semiconductor substrate to expose a first inactive region of said substrate;

etching the exposed semiconductor substrate by said first pattern to form a trench;

forming a first device isolation layer by filling insulating material in the trench;

forming a second pattern on the semiconductor substrate to expose a second inactive region of the substrate; and forming a second device isolation layer in the second inactive region by local oxidation;

wherein a distance between said first device isolation layer and said second device isolation layer is less than 2000 Å; and wherein said first inactive region exists in the cell array portion and said second inactive region exists in the peripheral portion.

5. An isolation method of a semiconductor device according to claim 4, wherein said first device isolation layer is formed of a CVD oxide layer.

6. An isolation method as claimed in claim 4, wherein, after the step of forming said first device isolation layer, said first device isolation layer is etched back by using a CMP method.

7. An isolation method as claimed in claim 4, wherein, after the step of forming said first device isolation layer, said first device isolation layer is etched back by using a reactive ion etching method.

8. An isolation method as claimed in claim 4, wherein, in the step of forming second device isolation layer, a bird's beak is generated during said local oxidation and shares a boundary with said trench.

9. A method of forming an isolation region in a semiconductor device, comprising the steps of:

forming a narrow isolation region in a first inactive region of a semiconductor substrate by a trench isolation method; and forming a wide isolation layer in a second inactive region which is wider than the first inactive region by a local oxidation method;

wherein said local oxidation method forms a bird's-beak which prevents exposure of an active region between said narrow and wide isolation regions and wherein said first inactive region exists in a cell array portion and said second inactive region exists in a peripheral portion.

* * * * *